VACUUM VAPOR DEPOSITION WITH CONTROL OF ELEVATION OF METAL MELT
Original Filed March 13, 1969
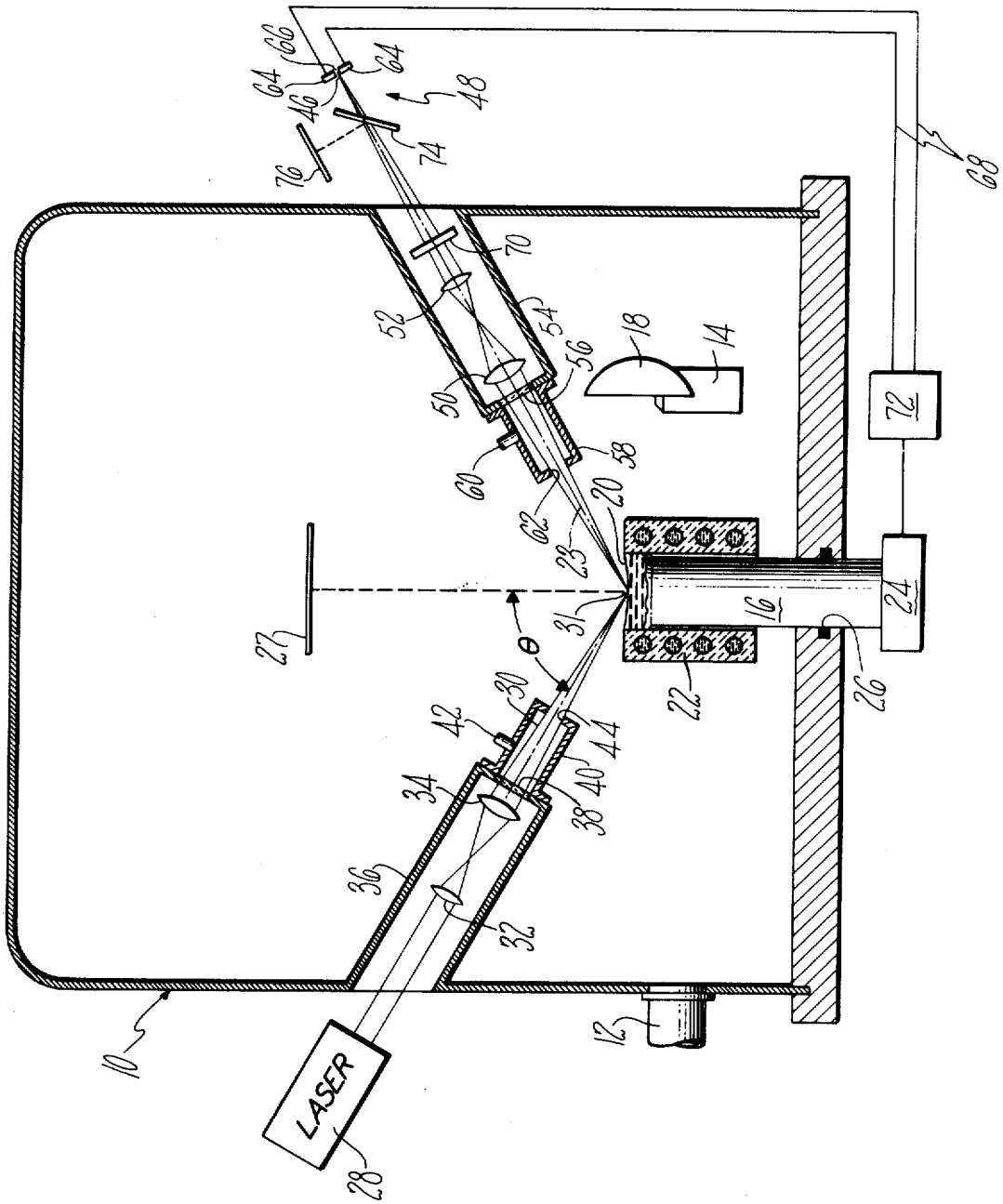
INVENTOR.
RANDOLPH D. HOUSE
BY
ATTORNEY United States Patent Office Re. 27,930
Reissued Feb. 26, 1974

27,930

VACUUM VAPOR DEPOSITION WITH CONTROL OF ELEVATION OF METAL MELT

Randolph D. House, Manchester, Conn., assignor to United Aircraft Corporation, East Hartford, Conn.

Original No. 3,574,650, dated Apr. 13, 1971, Ser. No. 806,956, Mar. 13, 1969. Application for reissue Jan. 31, 1972, Ser. No. 222,012

Int. Cl. C23c *13/02, 13/12*

U.S. Cl. 117—106 7 Claims

Matter enclosed in heavy brackets [ ] appears in the original patent but forms no part of this reissue specification; matter printed in italics indicates the additions made by reissue.

ABSTRACT OF THE DISCLOSURE

In the processes for forming protective coatings on metal substrates, particularly the nickel-base and cobalt-base superalloys, by melting a coating material to cause vaporization thereof, a monochromatic light beam is utilized in sensing and controlling displacement of the surface elevation of the melt.

BACKGROUND OF THE INVENTION

The present invention relates in general to a method for sensing changes in the relative location of a material and more particularly relates to an electro-optical method for sensing and controlling the relative surface location of a light reflective material. The invention is particularly useful in detecting and controlling the surface elevation of an incandescent metal melt as it is depleted by evaporation in a vacuum vapor deposition process.

It is well known that the conventional nickel-base and cobalt-base superalloys do not in and of themselves exhibit sufficient oxidation-erosion resistance to provide component operating lives of reasonable duration in the dynamic oxidizing environments such as those associated with the operation of gas turbine engines. Accordingly, it has been the usual practice to provide these alloys with a protective coating in such applications.

Although the aluminide coatings, such as that described in the patent to Joseph 3,102,044, have in the past displayed satisfactory performance, it is well known that these coatings, because of their dependence upon the availability of substrate elements, often are characterized by a composition less than optimum.

Many of the more advanced coatings developed for the next generation of jet engines depend in the first instance on the deposition of a high melting point coating alloy with a concurrent or subsequent reaction with the substrate to attain the desired end composition, microstructure or adherence. These new alloys generally demand the application of special coating techniques to provide the right species in the right amounts on the surfaces to be protected.

Several coating compositions of current interest are described in detail in copending applications of the present assignee. Among these compositions is that hereinafter referred to as the FeCrAlY coating at a nominal composition of, by weight, 30 percent chromium, 15 percent aluminum, 0.5 percent yttrium, balance iron, as discussed in the copending application of Frank P. Talboom, Jr. et al. entitled "Iron Base Coating for the Superalloys," Ser. No. 731,650, filed May 23, 1968. Another such composition is the CoCrAlY composition at about, by weight, 21 percent chromium, 15 percent aluminum, 0.7 percent yttrium, balance cobalt.

The basic problems associated with the deposition of these coating alloys relates to their high melting points and the difficulty of providing the right amount of all of the alloy species in the coating as applied. Satisfactory results have been attained through the use of vacuum vapor deposition techniques, such as that suggested in the patent to Steigerwald 2,746,420. These processes, which have in the past been primarily directed toward the application of relatively low temperature materials of relatively simple composition are, in the present instance, characterized by extreme sensitivity to variations in the process parameters and, accordingly, reproducibility as well as processing expense are formidable problems.

A significant problem in existing vacuum vapor deposition processes has been a lack of effective means for sensing and maintaining the molten source pool at a constant height. It has been demonstrated that coating efficiency, composition and uniformity are very susceptible to pool height changes. This is true not only with regard to relative changes in position and spacing between source and substrate, but more importantly, with regard to relative changes in elevation of the molten pool within the crucible. Recently, several techniques have been developed to improve the effectiveness of the basic process through the mechanism of monitoring the coating source material elevation. In one such method, a radioactive isotope is utilized as a source of radiation in a system wherein the amount of radiation passing over or through the molten pool indicates the elevational location thereof.

SUMMARY OF THE INVENTION

The present invention contemplates detection and control of a displaceable material having reflective properties by the utilization of a light beam of sufficient intensity to be monitored in reflection.

According to a preferred embodiment of the invention, a high intensity monochromatic light beam such as a laser beam is utilized in a vapor vacuum deposition process and is focused on the surface of the molten source metal pool at a predetermined angle of incidence. The reflected beam is refocused onto a photodetector which is sensitive to movements of the beam caused by elevational displacement of the pool surface. The photodetector, in essence, monitors and maintains the evaporating molten metal at a constant elevation to ensure process uniformity and reproducibility.

BRIEF DESCRIPTION OF THE DRAWING

An understanding of the invention will become more apparent to those skilled in the art by reference to the following detailed description when viewed in light of the accompanying drawing, wherein is shown a schematic illustration, partially in section, of a vacuum vapor coating apparatus in accordance with this invention.

DESCRIPTION OF THE PREFERRED EMBODIMENTS

In one particular embodiment as illustrated in the drawing, there is shown a vacuum chamber 10 having an exit port 12 leading to a suitable high vacuum pump, preferably of the diffusion type, for the rapid and continuous evacuation of the chamber. Located inside the chamber, there is shown an electron gun 14 for generating a beam of charged particles to impinge upon and vaporize an ingot of source metal 16. It will be appreciated by those skilled in the art that the electron beam is suitably directed by conventional magnetic deflection pole pieces 18. Of course, the arrangement of the electron beam gun within the vacuum chamber is a function of design. A 30 kilowatt electron beam unit has been used to melt and vaporize the upper end of ingot 16 to create a molten source pool having a reflecting surface 20. Satisfactory deposition rates have been achieved with a two inch diameter ingot of a FeCrAlY coating material, the depth of the molten pool usually being ¼–½ inch.

The ingot 16 is slidably received at its upper end by a fixed annular water cooled copper crucible 22. The ingot is movable vertically by an actuator or motor means 24 which in turn is electrically controlled by means hereinafter described. The ingot 16 passes through a suitable heat resistant vacuum seal 26 in the chamber base.

A substrate 27, to be coated, is disposed within the vacuum chamber vertically above the pool surface 20. Since the process is fundamentally line-of-sight, the part is typically mounted to effect rotation about its longitudinal axis, usually utilizing a vacuum sealed pass-through (not shown) through the vacuum chamber to an external drive system. Of course, more than one part may be coated at a time. In such a case, in order to minimize non-uniformity of coating between each of the plurality of parts, each part is normally mounted in a plane of vapor isodensity or roughly along an arc defining a zone of constant vapor concentration, the parts closest to the vertical passing through the center of the molten pool being located slightly farther from the pool surface than those positioned at an angle with respect to the said vertical. Whether coating a single part or a plurality of parts however, each substrate is further positioned as close as possible to the surface of the molten source pool without being subjected to undesirable coating contamination by splash from the pool The substrate height varies with each system but for a two inch diameter pool and a deposition rate of about 0.3 mil per minute with a FeCrAlY coating material, a mean height of about 10 inches has been found satisfactory.

As indicated previously, keeping the molten pool surface at a constant elevation is of great importance in maximizing coating efficiency, uniformity and composition. Although prior attempts to monitor and control vapor source materials have been useful, it is believed that the present electro-optical displacement sensing system is distinct and advantageous in accomplishing this end.

As shown in the drawing, there is provided a source of high energy monochromatic light, such as a laser 28. In practice, a 1.0 milliwatt helium-neon gas laser has been found satisfactory. The light beam, designated by the numeral 30, is projected and focused to a small spot 31 on the reflecting surface 20 of the molten body by appropriate source optics, such as by a microscope objective lens 32 and a plano-convex lens 34. The optical components 32 and 34 are protected against vapor fouling by an inwardly projecting tubular encasement 36 having a transparent window 38 which seals the aforementioned optics from the chamber. The window 38 is itself protected against fouling by suitable apparatus, such as a tube shield 40 provided with an inert gas sweep introduced through a gas inlet 42. The free end of the shield 40 is apertured at 44 with the opening just large enough to permit uninterrupted passage of the light beam. The relative sizes of the optical and protective components can of course vary. However, best results have been obtained by providing a large focal distance between the lens 34 and the spot 31, and a relatively small aperture 44. For example, components giving a focal distance of 33 inches with a beam diameter of ½ inch at the lens 34 and a tube shield 15 inches long and apertured to closely circumscribe the beam at a location approximately 16 inches from the spot 31 were found desirable. As will subsequently be understood, such a relation is advantageous in that there is provided a large depth of field which reduces the effect of a changing spot size at the deflector face due to changes in the height of the molten pool. Further, a long focal distance ensures a greater separative distance from the molten pool to minimize vapor condensate contamination while a small aperture 44 corresponding to the small diameter beam reduces the gas load, on the vacuum system, imposed by the protective inert gas sweep.

The light beam reflected from spot 31 is intercepted and focused onto a spot 46 on the face of a light sensitive detector 48 by similar appropriate detector optics such as plano-convex lens 50 and microscope objective lens 52. The detector optics are protected againt vapor fouling in the same way as the source optics. There is provided an encasement 54 having a window 56, the window being protected by an inert gas sweep in a tube shield 58 with a gas inlet 60 and aperture 62. The detector 48 is preferably comprised of matching photoelectric cells 64, disposed within the focal plane of the reflected beam and separated by a narrow horizontal gap 66, with each cell connected to appropriate electrical lead lines 68. In practice, a photodetector comprised of a two element silicon Schottky barrier photodiode has been found satisfactory. The detector 48 is preceded by a narrow bandpass filter 70 which has its bandpass centered on the laser wavelength, and which is preferably a narrow bandpass dielectric film optical interference filter. It can be seen that as the source material is depleted by evaporation, the pool surface 20 is lowered in elevation, thus altering the vertical and horizontal position of the spot 31 on the pool surface where reflection occurs.

The component of motion of the spot 31 along a line normal to the optical axis 23 of the detector optics and lying in a vertical plane containing the optical axis, changes the angular position of the spot with respect to the axis of the detector optics. The spot 46 is concomitantly displaced from a position of balance in relation to the gap 66 to a position of imbalance whereby the spot impinges more fully on one photocell 64 than the other, thus causing electrically unbalanced signals to be generated in the lead lines 68. By connecting the lead lines from opposite sides of the detector 48 to a signal processor 72, in turn connected to the actuator 24, it will be appreciated by those skilled in the art that the photocells 64 may be employed as the active elements of a Wheatstone bridge circuit including in the signal processor whereby unbalancing of electrical signals can be utilized to cause the actuator to move the ingot 16 in the appropriate direction until balance is achieved.

In the described system, it is recognized that the surface of the molten metal pool in the vicinity of the small reflecting spot 31 is continually tilting at random by virtue of surface waves traversing the pool which constantly alter the direction of the reflected beam. In order to avoid excessive sensitivity to the tilting of the reflecting surface, the detector optics 50, 52 are positioned so that the reflecting spot 31 and the photoelectric detector 48 are at the conjugate foci thereof. In this way, even though the surface wave amplitudes may become large enough to cause the reflected beam to miss, at times, the detector optics entirely, the system still functions effectively because there results a periodic sweeping of the beam across the aforementioned detector optics. At each sweep, the detectors produce output pulses the relative magnitudes of which are dependent upon the height of spot 31 during the brief interval that the reflected beam is intercepted by the detector optics. The signal processor time averages the pulses and provides a control signal proportional to the difference between a desired control height and the time average height of the molten surface.

In order to maintain a high sensitivity to pool height changes, the incident beam 30 is preferably projected at a relatively large angle of incidence, $\theta$. It will be appreciated that since the sensitivity to pool height is proportional to twice the sine of the angle $\theta$, an angle of incidence in the range of 30° to 80° is preferable, although the system is operable at angles as small as 10°. An angle of incidence of approximately 70° however is found to give best results in the present system since 70° affords a satisfactory compromise between optimizing sensitivity while avoiding interference by the edges of the crucible with the incident and reflected beams.

A conventional beam splitter 74 and viewing screen with integral reticle 76 are illustrated as providing a means for effecting visual observation of the elevation of the pool surface.

It is to be understood that various modifications can be made without departing from the spirit of the present invention. It is recognized, for example, that while high intensity monochromatic electromagnetic radiation is necessary for incandescent targets such as high melting point molten metals, that polychromatic radiation may be utilized on bodies, molten or solid, which are held at lower temperatures so long as they are sufficiently reflective. It is similarly recognized that the body to be monitored can have reflective properties without inherently possessing a surface that is effectual as a reflector. In other words, the technique is also operable with a relatively non-reflective body which is given reflective properties by having an auxiliary reflecting surface element provided thereon.

What has been set forth above is intended primarily as exemplary to enable those skilled in the art in the practice of the invention and it should therefore be understood that within the scope of the appended claims, the invention may be practiced in other ways than as specifically described.

What is claimed is:

1. In the processes for forming protective coatings of metallic material on a substrate by vacuum vapor deposition, the improvement which comprises:
   - melting metallic coating material in a crucible to form a molten pool,
   - evaporating molten pool, thereby causing a lowering of the pool surface elevation,
   - establishing an incident beam of monochromatic light on said molten pool surface, said incident beam being focused onto a spot thereon,
   - focusing, by optical means, the reflected beam onto a photodetector, said spot and said photodetector being located at the conjugate foci of the optical means whereby changes in the molten surface elevation are detected, and
   - generating signals in said photodetector proportional to said detected changes to raise said molten pool to maintain its surface at a constant elevation.

2. The invention of claim 1 wherein the angle of incidence of the beam is approximately 70°.

3. In the processes for forming protective coatings of metallic material on a substrate by vacuum vapor deposition, the improvement which comprises:
   - feeding an ingot of coating material upwardly through an annular crucible;
   - melting the upper end of said ingot to form an evaporating pool having a surface level within said crucible;
   - establishing an incident beam of monochromatic light on said molten pool surface, said incident beam being focused to a spot thereon;

- detecting changes in the position of said spot, and
   - generating signals proportional to said detected changes to cause movement of said ingot to maintain said molten pool surface at a constant elevation.

4. The invention of claim 3 wherein changes in the position of said spot are detected by focusing, by optical means, the reflected light beam onto a photodetector with said spot and said photodetector being at the conjugate foci of the optical means.

5. The invention of claim 4 wherein the angle of incidence of the beam is approximately 70°.

*6. A method for sensing elevational displacement of a vaporizable molten metal pool whose surface is continually randomly tilting due to surface wave activity thereon during vacuum vapor depositing comprising:*
   - *establishing an incident beam of high energy monochromatic light on said molten metal pool surface,*
   - *focusing said incident beam to a spot on said surface,*
   - *focusing, by optical means, the reflected beam onto a photodetector, said spot and said photodetector being located at the conjugate foci of the optical means whereby sensitivity to the tilting of the surface is eliminated and changes in the molten surface elevation are detected, and*
   - *generating signals in said photodetector proportional to said detected changes to raise said molten pool to maintain its surface at a constant elevation.*

*7. The invention of claim 6 wherein the angle of incidence of the beam is from 30° to 80°.*

References Cited

The following references, cited by the Examiner, are of record in the patented file of this patent or the original patent.

UNITED STATES PATENTS

| | | | |
|---|---|---|---|
| 2,746,420 | 5/1956 | Steigerwald | 118—49 X |
| 3,086,889 | 4/1963 | Strong | 117—107 X |
| 3,114,790 | 12/1963 | Hanks | 118—9 X |
| 3,117,024 | 1/1964 | Ross | 118—9 X |
| 3,123,712 | 3/1964 | Spooner | 250—43.5 IX |
| 3,170,383 | 2/1965 | Hunt | 118—9 UX |
| 3,244,557 | 4/1966 | Chiou et al. | 117—7 UX |
| 3,316,468 | 4/1967 | Hanks | 118—9 X |
| 3,347,701 | 10/1967 | Yamayishi et al. | 118—49.1 X |
| 3,373,278 | 3/1968 | Cilyo | 250—49.5 |

RALPH S. KENDALL, Primary Examiner

U.S. Cl. X.R.

118—7, 49.5; 250—43.5 FL, 216